United States Patent
Haba et al.

(10) Patent No.: US 9,728,495 B2
(45) Date of Patent: Aug. 8, 2017

(54) RECONFIGURABLE POP

(71) Applicant: Invensas Corporation, San Jose, CA (US)

(72) Inventors: Belgacem Haba, Saratoga, CA (US); Richard Dewitt Crisp, Hornitos, CA (US); Wael Zohni, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/775,119

(22) PCT Filed: Mar. 10, 2014

(86) PCT No.: PCT/US2014/022461
§ 371 (c)(1),
(2) Date: Sep. 11, 2015

(87) PCT Pub. No.: WO2014/150168
PCT Pub. Date: Sep. 25, 2014

(65) Prior Publication Data
US 2016/0035656 A1 Feb. 4, 2016

Related U.S. Application Data

(63) Continuation of application No. 13/898,952, filed on May 21, 2013, now Pat. No. 8,786,069.
(Continued)

(51) Int. Cl.
*H01L 23/02* (2006.01)
*H01L 23/498* (2006.01)
(Continued)

(52) U.S. Cl.
CPC ........ *H01L 23/49811* (2013.01); *G11C 5/025* (2013.01); *G11C 5/04* (2013.01);
(Continued)

(58) Field of Classification Search
CPC ........... H01L 2224/32145; H01L 25/10; H01L 25/105; H01L 25/117; H01L 2225/1011
(Continued)

(56) References Cited

U.S. PATENT DOCUMENTS 5,148,265 A 9/1992 Khandros et al.
5,148,266 A 9/1992 Khandros et al.
(Continued)

FOREIGN PATENT DOCUMENTS

EP 2544230 A1 1/2013

OTHER PUBLICATIONS

International Search Report and Written Opinion for Application No. PCT/US2014/022461 dated Jul. 18, 2014.
(Continued)

*Primary Examiner* — Matthew E Warren
(74) *Attorney, Agent, or Firm* — Lerner, David, Littenberg, Krumholz & Mentlik, LLP (57) ABSTRACT

A microelectronic package (10) can include lower and upper package faces (11, 12), lower terminals (25) at the lower package face, upper terminals (45) at the upper package face, first and second microelectronic elements (30) each having memory storage array function, and conductive interconnects (15) each electrically connecting at least one lower terminal with at least one upper terminal. The conductive interconnects (15) can include first conductive interconnects (15*a*) configured to carry address in formation, signal assignments of a first set (70*a*) of the first interconnects having (180) rotational symmetry about a theoretical rotational axis (29) with signal assignments of a second set (70*b*) of first interconnects. The conductive interconnects (15) can also include second conductive interconnects (15*b*) configured to carry data information, the position of each second conductive interconnect having (180) rotational symmetry
(Continued)

about the rotational axis (29) with a position of a corresponding no-connect conductive interconnect (15d).

20 Claims, 3 Drawing Sheets

Related U.S. Application Data (60) Provisional application No. 61/798,475, filed on Mar. 15, 2013.

(51) Int. Cl.
| | |
|---|---|
| H01L 25/065 | (2006.01) |
| H01L 23/538 | (2006.01) |
| G11C 5/02 | (2006.01) |
| G11C 5/04 | (2006.01) |
| G11C 5/06 | (2006.01) |
| H01L 25/10 | (2006.01) |
| H01L 23/00 | (2006.01) |

(52) U.S. Cl.
CPC .......... *G11C 5/063* (2013.01); *H01L 23/5386* (2013.01); *H01L 23/5389* (2013.01); *H01L 24/48* (2013.01); *H01L 25/0655* (2013.01); *H01L 25/0657* (2013.01); *H01L 25/105* (2013.01); *H01L 23/49816* (2013.01); *H01L 2224/16225* (2013.01); *H01L 2225/1035* (2013.01); *H01L 2225/1058* (2013.01); *H01L 2924/00014* (2013.01); *H01L 2924/15311* (2013.01)

(58) Field of Classification Search
USPC .......................... 257/685, 686, 723, 773, 786
See application file for complete search history.

(56) References Cited

U.S. PATENT DOCUMENTS

| | | | |
|---|---|---|---|
| 5,679,977 A | 10/1997 | Khandros et al. | |
| 6,177,636 B1 | 1/2001 | Fjelstad | |
| 7,358,616 B2* | 4/2008 | Alam | H01L 25/0657 257/620 |
| 8,345,441 B1 | 1/2013 | Crisp et al. | |
| 8,791,559 B2* | 7/2014 | Kim | H01L 25/105 257/686 |
| 2004/0232559 A1* | 11/2004 | Adelmann | H01L 23/3128 257/777 |
| 2004/0245617 A1* | 12/2004 | Damberg | H01L 25/0652 257/686 |
| 2005/0285248 A1 | 12/2005 | See et al. | |
| 2007/0194447 A1 | 8/2007 | Ruckerbauer | |
| 2012/0032340 A1 | 2/2012 | Choi et al. | |
| 2012/0056312 A1 | 3/2012 | Pagaila et al. | |
| 2012/0061855 A1 | 3/2012 | Do et al. | |
| 2012/0313239 A1 | 12/2012 | Zohni | |
| 2012/0313253 A1 | 12/2012 | Nakadaira et al. | |
| 2014/0055942 A1* | 2/2014 | Crisp | B81B 7/007 361/679.32 |

OTHER PUBLICATIONS

Taiwanese Office Action for Application No. 103108982 dated Jun. 15, 2015.

* cited by examiner

RECONFIGURABLE POP

CROSS-REFERENCE TO RELATED APPLICATIONS

The present application is a national phase entry under 35 U.S.C. §371 of International Application No. PCT/US2014/022461 filed Mar. 10, 2014, published in English, which is a continuation of U.S. patent application Ser. No. 13/898,952, filed May 21, 2013, which claims the benefit of the filing date of U.S. Provisional Patent Application No. 61/798,475, filed Mar. 15, 2013. The entire disclosures of each of the above-identified applications are hereby incorporated herein by reference.

BACKGROUND OF THE INVENTION

The subject matter of the present application relates to microelectronic packages and assemblies incorporating microelectronic packages.

Semiconductor chips are commonly provided as individual, prepackaged units. A standard chip has a flat, rectangular body with a large front face having contacts connected to the internal circuitry of the chip. Each individual chip typically is contained in a package having external terminals connected to the contacts of the chip. In turn, the terminals, i.e., the external connection points of the package, are configured to electrically connect to a circuit panel, such as a printed circuit board. In many conventional designs, the chip package occupies an area of the circuit panel considerably larger than the area of the chip itself. As used in this disclosure with reference to a flat chip having a front face, the "area of the chip" should be understood as referring to the area of the front face.

In "flip chip" designs, the front face of the chip confronts the face of a package dielectric element, i.e., substrate of the package, and the contacts on the chip are bonded directly to contacts on the face of the substrate by solder bumps or other connecting elements. In turn, the substrate can be bonded to a circuit panel through the external terminals that overlie the substrate. The "flip chip" design provides a relatively compact arrangement; each package occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference. Certain innovative mounting techniques offer compactness approaching or equal to that of conventional flip-chip bonding. Packages that can accommodate a single chip in an area of the circuit panel equal to or slightly larger than the area of the chip itself are commonly referred to as "chip-scale packages."

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components that form the interconnections should not greatly increase the size of the assembly. Similar needs arise in other applications as, for example, in data servers such as those used in internet search engines where increased performance and size reduction are needed.

Semiconductor chips containing memory storage arrays, particularly dynamic random access memory chips (DRAMs) and flash memory chips are commonly packaged in single-chip or multiple-chip packages and assemblies. Each package has many electrical connections for carrying signals, power and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds that extend in both horizontal and vertical directions relative to the surface of the chip.

The transmission of signals within packages to chips of multi-chip packages poses particular challenges, especially for signals common to two or more chips in the package such as clock signals, and address and strobe signals for memory chips. Within such multi-chip packages, the lengths of the connection paths between the terminals of the package and the chips can vary. The different path lengths can cause the signals to take longer or shorter times to travel between the terminals and each chip. Travel time of a signal from one point to another is called "propagation delay" and is a function of the conductor length, the conductor's structure, and other dielectric or conductive structure in close proximity therewith.

Conventional microelectronic packages can incorporate a microelectronic element that is configured to predominantly provide memory storage array function, i.e., a microelectronic element that embodies a greater number of active devices to provide memory storage array function than any other function. The microelectronic element may be or include a DRAM chip, or a stacked electrically interconnected assembly of such semiconductor chips. Typically, all of the terminals of such package are placed in sets of columns adjacent to one or more peripheral edges of a package substrate to which the microelectronic element is mounted.

In light of the foregoing, certain improvements can be made to multi-chip microelectronic packages and assemblies in order to improve electrical performance. These attributes of the present invention can be achieved by the construction of the microelectronic packages and assemblies as described hereinafter.

BRIEF SUMMARY OF THE INVENTION

In accordance with an aspect of the invention, a microelectronic package can include a lower package face, an upper package face opposite the lower package face, and peripheral package edges bounding the lower and upper package faces, lower terminals at the lower package face configured for connection with a first component, upper terminals at the upper package face configured for connection with a second component, first and second microelectronic elements each having memory storage array function, and conductive interconnects each electrically connecting at least one lower terminal with at least one upper terminal. Element faces of the first and second microelectronic elements can be arranged in a single plane parallel to the lower package face. The first and second microelectronic elements each can have contacts at the respective element face. At least some of the conductive interconnects can be electrically connected with the contacts of the microelectronic elements.

The conductive interconnects can include first conductive interconnects configured to carry address information and can include first and second sets of interconnects disposed on respective first and second opposite sides of a theoretical plane normal to the lower package face. Signal assignments of the first set of interconnects can have 180° rotational symmetry about a theoretical rotational axis of the microelectronic package with signal assignments of the second set of interconnects. The rotational axis can be being normal to the lower package face and can extend in the theoretical plane.

The conductive interconnects can also include second conductive interconnects configured to carry data information to and from one of the microelectronic elements and can include third and fourth sets of interconnects disposed on the respective first and second sides of the theoretical plane. The position of each second conductive interconnect can have 180° rotational symmetry about the rotational axis with a position of a corresponding no-connect conductive interconnect that is electrically insulated from the microelectronic elements within the microelectronic package.

In one example, the lower package face can have corners located at intersections between adjacent ones of the peripheral package edges. The lower package face can define a center at an intersection between a first line extending between a first opposite pair of the corners and a second line extending between a second opposite pair of the corners. The rotational axis can intersect a location at or near the center the lower package face. In a particular embodiment, the element faces of the microelectronic elements can be spaced apart from one another in a direction of the single plane to define a central region between adjacent edges of the microelectronic elements and peripheral regions between peripheral edges of the element faces and respective adjacent peripheral package edges. The first conductive interconnects can be aligned with the central region.

In an exemplary embodiment, the second conductive interconnects can be aligned with at least one of the peripheral regions. In a particular example, the at least some of the first conductive interconnects can be configured to carry address information usable by circuitry within the microelectronic package to determine an addressable memory location from among all the available addressable memory locations of a memory storage array of at least one of the microelectronic elements. In one embodiment, the first conductive interconnects can be configured to carry all of the address information usable by circuitry within the microelectronic package to determine an addressable memory location from among all the available addressable memory locations of a memory storage array within the microelectronic elements.

In one example, the first conductive interconnects can be configured to carry address information and command information. In a particular embodiment, a dielectric layer can be formed on surfaces of the microelectronic elements. The microelectronic package can also include traces formed on the dielectric layer and connected with the contacts of the microelectronic elements and the first and second conductive interconnects. In an exemplary embodiment, the traces can include first and second traces. The first traces can extend in a first direction perpendicular to the first axis between the contacts of the microelectronic elements and the first conductive interconnects. The second traces can extend in a second direction parallel to the first axis between the contacts of the microelectronic elements and the second conductive interconnects.

In a particular example, the microelectronic package can also include a substrate. A surface of a dielectric layer that defines one of the upper package face or the lower package face can be a first surface of the substrate. In one embodiment, the substrate can have at least one aperture extending through a thickness thereof. The contacts of one or more of the microelectronic elements can be aligned with the at least one aperture and can be electrically connected with substrate contacts at the first surface of the substrate by a plurality of leads. In one example, at least some of the leads can include wire bonds extending through the at least one aperture.

In a particular embodiment, the microelectronic package can include a heat spreader in thermal communication with at least one of the microelectronic elements. In an exemplary embodiment, the microelectronic package can also include third and fourth microelectronic elements each having memory storage array function. Element faces of the first, second, third, and fourth microelectronic elements can be arranged in the single plane parallel to the lower package face. The third and fourth microelectronic elements can each having contacts at the respective element face.

In a particular example, the theoretical plane can be a first theoretical plane. The microelectronic package can define a second theoretical plane normal to the lower package face and the first theoretical plane. The microelectronic package can also include third conductive interconnects configured to carry chip select information to and from the microelectronic elements. Signal assignments of the first conductive interconnects and the third conductive interconnects on the first side of the first theoretical plane can be a mirror image of the signal assignments of the first conductive interconnects on the second side of the first theoretical plane. Signal assignments of the first conductive interconnects and the third conductive interconnects on a first side of the second theoretical plane can be a mirror image of the signal assignments of the first conductive interconnects on a second side of the second theoretical plane opposite the first side of the second theoretical plane.

In one embodiment, the microelectronic package can also include third conductive interconnects configured to carry chip select information to and from the microelectronic elements and including fifth and sixth sets of interconnects disposed on the respective first and second sides of the theoretical plane. The position of each third conductive interconnect of one of the fifth or sixth sets of interconnects can have 180° rotational symmetry about the rotational axis with a position of a corresponding third conductive interconnect of the other of the fifth or sixth sets of interconnects.

In one example, a stacked microelectronic assembly can include first and second identical microelectronic packages each as described above. The first microelectronic package can have the same rotational orientation about its rotational axis relative to the second microelectronic package. Each of the first, second, and third conductive interconnects of the first microelectronic package can overlie and can be electrically connected with a corresponding one of the respective first, second, and third conductive interconnects of the second microelectronic package having the same signal assignment. Each no-connect conductive interconnect of the first microelectronic package can overlie and can be electrically connected with a no-connect conductive interconnect of the second microelectronic package.

In a particular embodiment, a stacked microelectronic assembly can include first and second identical microelectronic packages each as described above. The first microelectronic package can be rotated about its rotational axis by 180° relative to the second microelectronic package. Each of the first and third conductive interconnects of the first microelectronic package can overlie and can be electrically connected with a corresponding one of the respective first and third conductive interconnects of the second microelectronic package having the same signal assignment. Each second conductive interconnect of the first microelectronic package can overlie and can be electrically connected with a no-connect conductive interconnect of the second microelectronic package. Each second conductive interconnect of the second microelectronic package can underlie and can be electrically connected with a no-connect conductive interconnect of the first microelectronic package.

In an exemplary embodiment, a stacked microelectronic component can include first and second stacked microelectronic assemblies each as described above. The rotational axis of each of the microelectronic packages can be coincident with one another. The first and second conductive interconnects of the first microelectronic package of the first stacked microelectronic assembly can have identical locations and signal assignments as the first microelectronic package of the second stacked microelectronic assembly. The first and second conductive interconnects of the second microelectronic package of the first stacked microelectronic assembly can have identical locations and signal assignments as the second microelectronic package of the second stacked microelectronic assembly. Each third conductive interconnect of each microelectronic package of the first microelectronic assembly can be electrically connected with a no-connect conductive interconnect of each microelectronic package of the second microelectronic assembly. Each third conductive interconnect of each microelectronic package of the second microelectronic assembly can be electrically connected with a no-connect conductive interconnect of each microelectronic package of the second microelectronic assembly.

In a particular example, the microelectronic assembly can also include at least one passive element electrically connected to the first microelectronic package. In one embodiment, the at least one passive element can include at least one decoupling capacitor. In one example, the microelectronic assembly can also include a circuit panel having plurality of panel contacts at a panel face thereof and at least one of: a decoupling capacitor, a termination resistor, or a driving element thereon. At least at least some of the upper terminals of the first microelectronic package can be joined to the panel contacts. In a particular embodiment, the microelectronic assembly can also include a circuit panel having a plurality of panel contacts at a panel face thereof. At least some of the lower terminals of the second microelectronic package can be joined to the panel contacts.

In an exemplary embodiment, the panel contacts can be electrically connected with the microelectronic elements of the first microelectronic package through the conductive interconnects of the second microelectronic package. In a particular example, the microelectronic assembly can also include a device electrically connected to the first conductive interconnects of the first and second microelectronic packages. The device can be operable to drive the address information to the contacts of the microelectronic elements of the first and second microelectronic packages. In one embodiment, a system can include a microelectronic assembly as described above and one or more other electronic components electrically connected to the microelectronic assembly. In one example, the system can also include a housing, the microelectronic assembly and the one or more other electronic components being assembled with the housing.

DETAILED DESCRIPTION

Embodiments of the invention herein provide packages that have more than one semiconductor chip, i.e., a microelectronic element therein. A multiple chip package can reduce the amount of area or space required to connect the chips therein to a circuit panel, e.g., printed wiring board to which the package may be electrically and mechanically connected through an array of terminals, such as a ball grid array, land grid array or pin grid array, among others. Such connection space is particularly limited in small or portable computing devices, e.g., handheld devices such as "smartphones" or tablets that typically combine the function of personal computers with wireless connectivity to the broader world. Multi-chip packages can be particularly useful for making large amounts of relatively inexpensive memory available to a system, such as advanced high performance dynamic random access memory ("DRAM") chips, e.g., in DDR3 type DRAM chips and its follow-ons.

Heat dissipation also presents a challenge for advanced chips, such that it is desirable for at least one of the large flat surfaces of each chip to be coupled to a heat spreader or be exposed to or in thermal communication with a flow or air within an installed system. The packages described below can help to further these goals.

Figure 1A:
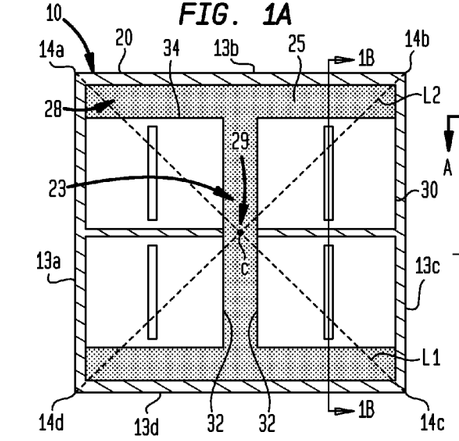
FIG. 1A is a top plan view of a microelectronic package according to an embodiment of the present invention.
Figure 1B:
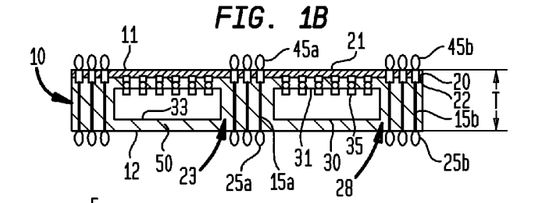
FIG. 1B is one possible side sectional view of the microelectronic package of FIG. 1A, taken along line 1B-1B of FIG. 1A.
Figure 1C:
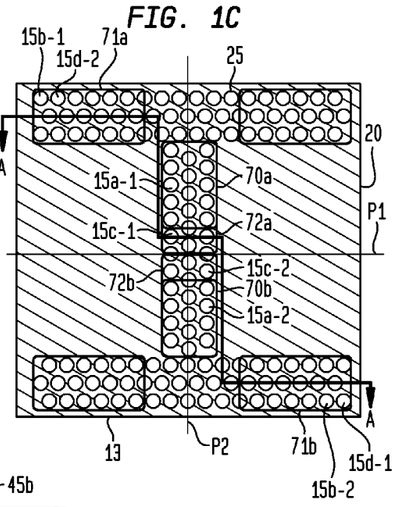
FIG. 1C is a top plan view of the microelectronic package of FIG. 1A, showing the locations of the conductive interconnects.

FIGS. 1A-1C illustrate a particular type of microelectronic package 10 according to an embodiment of the invention. As seen in FIGS. 1A-1C, the package 10 can have upper and lower opposed package faces 11, 12.

The package 10 can include at least two microelectronic elements 30 assembled with a substrate 20 having opposed first and second surfaces 21, 22. In one example, electrically conductive element contacts 35 at a face 31 of the microelectronic element 30 can face and be joined to electrically conductive substrate contacts at the second surface 22, for example, with flip-chip connections. As shown in FIG. 1A, the package 10 can have four microelectronic elements 30 mounted to the second surface 22 of the substrate 20. In other embodiments (not shown), the package 10 may include other numbers of microelectronic elements 30, such as two or eight microelectronic elements. Each of the element faces 31 of the microelectronic elements 30 can be disposed in a single plane parallel to the lower package face 11 of the second package 10.

The package 10 can further include an adhesive between the front face 31 of the microelectronic elements 30 and the second surface 22 of the substrate 20. The package 10 can also include an encapsulant 50 that can optionally cover, partially cover, or leave uncovered the rear surfaces 33 of the microelectronic elements 30.

FIG. 1C illustrates a potential sectional view of the embodiment described above relative to FIG. 1A, in which the microelectronic elements 30 are flip-chip bonded to the second surface 22 of the substrate 20. In such an embodiment, electrical connections between the microelectronic elements 30 and the substrate 20 include flip-chip connections extending between contacts of each of the microelectronic elements and conductive bond pads at the second surface 22 of the substrate.

The contacts 35 of each microelectronic element 30 can be arranged in one or more columns disposed in a central region of the front surface 31 that occupies a central portion of an area of the front surface. The central region, for example, may occupy an area of the front surface 31 that includes a middle third of the shortest distance between opposed edges of the microelectronic element 30.

In a particular example, each of the microelectronic elements 30 can be functionally and mechanically equivalent to the other ones of the microelectronic elements, such that each microelectronic element can have the same pattern of electrically conductive contacts 35 at the front surface 31 with the same function, although the particular dimensions of the length, width, and height of each microelectronic element can be different than that of the other microelectronic elements.

The microelectronic elements 30 can each be configured to predominantly provide a memory storage array function. For example, the microelectronic elements 30 can each be of type DDR3, DDR4, LPDDR3, GDDR5, or other generations of these types of memory elements such as DDRx, LPDDRx, or GDDRx. In such microelectronic element 30, the number of active devices, e.g., transistors, therein that are configured, i.e., constructed and interconnected with other devices, to provide memory storage array function, can be greater than the number of active devices that are configured to provide any other function. Thus, in one example, a microelectronic element 30 such as a DRAM chip may have memory storage array function as its primary or sole function.

In one example, each of the microelectronic elements can be bare chips or microelectronic units each incorporating a memory storage element such as a dynamic random access memory ("DRAM") storage array or that is configured to predominantly function as a DRAM storage array (e.g., a DRAM integrated circuit chip). As used herein, a "memory storage element" refers to a multiplicity of memory cells arranged in an array, together with circuitry usable to store and retrieve data therefrom, such as for transport of the data over an electrical interface.

In a particular embodiment, the package 10 can have four microelectronic elements 30, the contacts 35 of each microelectronic element including eight data I/O contacts. In another embodiment, the package 10 can have four microelectronic elements 30, the contacts 35 of each microelectronic element including sixteen data I/O contacts. In a particular example, the package 10 (and any of the other microelectronic packages described herein) can be configured to transfer, i.e., receive by the package, or transmit from the package thirty-two data bits in parallel in a clock cycle. In another example, the package 10 (and any of the other microelectronic packages described herein) can be configured to transfer sixty-four data bits in parallel in a clock cycle. A number of other data transfer quantities are possible, among which only a few such transfer quantities will be mentioned without limitation. For example, the package 10 (and any of the other microelectronic packages described herein) can be configured to transfer seventy-two data bits per clock cycle that can include a set of sixty-four underlying bits that represent data and eight bits that are error correction code ("ECC") bits for the sixty-four underlying bits. Ninety-six data bits, 108 bits (data and ECC bits), 128 data bits, and 144 bits (data and ECC bits) are other examples of data transfer widths per cycle that the package 10 (and any of the other microelectronic packages described herein) can be configured to support.

As used in this disclosure with reference to a substrate, a statement that an electrically conductive element is "at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate.

The package 10 can have package structure defining the upper and lower package faces 11, 12. The element face 31 of each of the microelectronic elements 30 can be oriented parallel to the first package face 11. The first package face 11 can be defined by a surface of a dielectric layer overlying the element faces 31 of the microelectronic elements 30. As shown in FIG. 1C for example, the first package face 11 can be the first surface 21 of the substrate 20. In other embodiments, the first package face 11 can be a surface of an encapsulant 50 overlying the element faces 31 of the microelectronic elements 30, or a surface of an encapsulant overlying a lead frame.

In some cases, the substrate 20 can consist essentially of a material having a low coefficient of thermal expansion ("CTE") in a plane of the substrate (in a direction parallel to the first surface 21 of the substrate), i.e., a CTE of less than 12 parts per million per degree Celsius (hereinafter, "ppm/° C."), such as a semiconductor material e.g., silicon, or a dielectric material such as ceramic material or silicon dioxide, e.g., glass. Alternatively, the substrate 20 may include a sheet-like substrate that can consist essentially of a polymeric material such as polyimide, epoxy, thermoplastic, thermoset plastic, or other suitable polymeric material or that includes or consists essentially of composite polymeric-inorganic material such as a glass reinforced structure of BT resin (bismaleimide triazine) or epoxy-glass, such as FR-4, among others. In one example, such a substrate 20 can consist essentially of a material having a CTE of less than 30 ppm/° C. in the plane of the substrate, i.e., in a direction along its surface.

The directions parallel to the first surface 21 of the substrate 20 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal "up" or "down" directions in a gravitational frame of reference.

A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

Figure 3A:
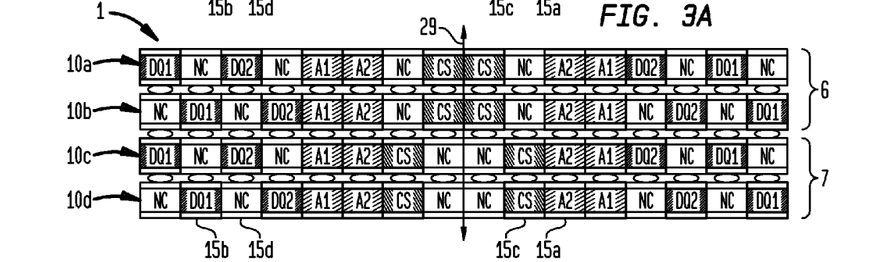
FIG. 3A is a diagrammatic side sectional view of a stacked assembly of four microelectronic packages according to an embodiment of the invention, taken along line A-A of FIG. 1C.
Figures 3B, 4A:
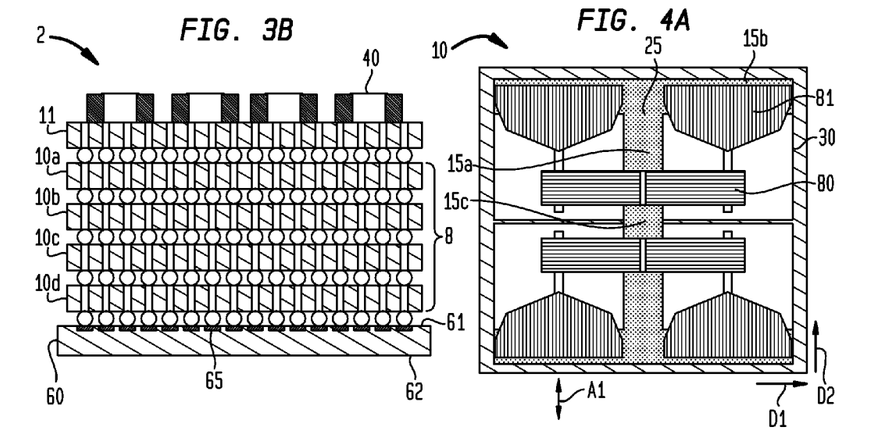
FIG. 3B is a side sectional view of a stacked assembly of four microelectronic packages according to another embodiment of the invention.
FIG. 4A is a top plan view of the microelectronic package of FIG. 1A, showing the locations of the signal busses.

As can be seen in FIG. 3B, for example, the substrate 20 can have at least one aperture (not shown) extending through the thickness T thereof. The element contacts 35 of one or more of the microelectronic elements can be aligned with the at least one aperture and can be electrically connected with substrate contacts at the first surface 21 of the substrate 20 by a plurality of leads, e.g., including wire bonds or lead bonds.

The package 10 can have lower terminals 25 at the lower package face 11 of the package, e.g., conductive pads, lands, or conductive posts or pins thereon. The lower terminals 25 can be electrically connected with at least some of the element contacts 35 of the microelectronic elements 30. The lower terminals 25 can include first terminals 25a that are configured to carry address information to the element contacts of the microelectronic elements 30, second terminals 25b configured to carry data I/O information to and from the element contacts, third terminals 25c configured as chip select terminals, and no-connect terminals 25d that are electrically insulated from the microelectronic elements within the microelectronic package 10. The lower terminals 25 can be configured to be joined to corresponding terminals or conductive contacts of another microelectronic component, such as a circuit panel or another microelectronic package.

The package 10 can have upper terminals 45 at the upper package face 12 of the package. The upper terminals 45 can be electrically connected with at least some of the element contacts 35 of the microelectronic elements 30. The upper terminals 45 can include first terminals 45a that are configured to carry address information to the element contacts of the microelectronic elements 30, second terminals 45b configured to carry data I/O information to and from the element contacts, third terminals 45c configured as chip select terminals, and no-connect terminals 45d that are electrically insulated from the microelectronic elements within the microelectronic package 10. The upper terminals 45 can be configured to be joined to corresponding terminals or conductive contacts of another microelectronic component, such as a circuit panel or another microelectronic package. In the examples shown in the figures, lower terminals 25 and the upper terminals 45 do not overlie any of the microelectronic elements 30.

The lower terminals 25 and the upper terminals 45 can function as endpoints for the connection of the second package 10 with corresponding electrically conductive elements of an external component such as circuit panel, e.g., printed wiring board, flexible circuit panel, socket, other microelectronic assembly or package, interposer, or passive component assembly, among others. In one example, such a circuit panel can be a motherboard or DIMM module board. In a particular embodiment, the terminals can be arranged in an area array such as a ball-grid array (BGA) (including joining elements as described below), a land-grid array (LGA), or a pin-grid array (PGA), among others.

In an exemplary embodiment, the lower terminals 25 and the upper terminals 45 (and any of the other terminals described herein) can include substantially rigid posts made from an electrically conductive material such as copper, copper alloy, gold, nickel, and the like. The lower terminals 25 and the upper terminals 45 can be formed, for example, by plating an electrically conductive material into openings in a resist mask, or by forming posts made, for example, of copper, copper alloy, nickel, or combinations thereof. Such posts can be formed, for example, by subtractively patterning a metal sheet or other metal structure into posts that extend away from the substrate 20 or an encapsulant 50 as terminals for electrically interconnecting the package 10 with another package 10, for example. The lower terminals 25 and the upper terminals 45 can be substantially rigid posts having other configurations, as described for example in U.S. Pat. No. 6,177,636, the disclosure of which is hereby incorporated herein by reference. In one example, the lower terminals 25 can have exposed contact surfaces that are coplanar with one another.

The lower terminals 25 can be connected with at least one of: the upper terminals 45; or the element contacts 35 through electrically conductive structure aligned with the central region 23 and extending between the inner edges 32 of the microelectronic elements 30. In one example, the lower and upper terminals 25, 45 can be connected to one another by electrically conductive interconnects 15 extending in a direction of a thickness T of the second package 10. In one example, the conductive interconnects 15 can be disposed in a bond via array configuration.

The conductive interconnects 15 can include first conductive interconnects 15a that are configured to carry address information to the element contacts 35 of the microelectronic elements 30, second conductive interconnects 15b configured to carry data I/O information to and from the element contacts, third conductive interconnects 15c configured as chip select terminals, and no-connect conductive interconnects 15d that are electrically insulated from the microelectronic elements within the microelectronic package 10. At least some of the no-connect conductive interconnects 15d can be pass-through electrical connections between the no-connect lower terminals 25d and the no-connect upper terminals 45d.

In one embodiment, at least some of the first conductive interconnects 15a can be configured to carry address information usable by circuitry within the package 10 to determine an addressable memory location from among all the available addressable memory locations of a memory storage array of at least one of the microelectronic elements 30 of the package. In a particular example, the first conductive interconnects 15a can be configured to carry all of the address information usable by circuitry within the microelectronic package 10 to determine an addressable memory location from among all the available addressable memory locations of a memory storage array within the microelectronic elements 30 of the package. In an exemplary embodiment, at least some of the first conductive interconnects 15a can be configured to carry command information.

At least portions of spaced apart inner edges 32 of respective ones of the microelectronic elements 30 can define a central region 23 of the substrate 20 (or of an alternative dielectric layer such as an encapsulant 50 overlying the element faces of the microelectronic elements). In one example, the central region 23 may not overlie any of the element faces 31 of the microelectronic elements 30. The inner edges 32 that define the central region 23 can face toward a centroid C of the package 10. In a particular embodiment, the central region 23 of the substrate can extend within a middle third of the distance between first and second opposed lateral edges 13a, 13c of the package 10, the lateral edges extending normal to the lower package face 11.

The microelectronic elements 30 and at least one of the outer edges 13a, 13b, 13c, 13d of the second package 10 can define a peripheral region 28 of the substrate 20. In one example, the peripheral region 28 may not overlie any of element faces 31 of the microelectronic elements 30. The peripheral region 28 can be bounded by one or more outer edges of each of the microelectronic elements, the outer edges including a first outer edge opposite the inner edge and second and third outer edges extending between the inner edge and the first outer edge.

In the embodiments shown in the figures, all of the first conductive interconnects 15a that carry address information within the package 10 and all of the third conductive interconnects 15c that carry chip select information within the package are aligned with the central region 23. In other embodiments (not shown), at least some of the first conductive interconnects 15a and/or at least some of the third conductive interconnects 15c can be aligned with the peripheral region 28.

In the embodiments shown in the figures, all of the second conductive interconnects 15b that carry data information within the package 10 are aligned with the peripheral region 28. In other embodiments (not shown), at least some of the second conductive interconnects 15b can be aligned with the central region 23.

In the embodiments shown in the figures, at least some of the no-connect conductive interconnects 15d that are electrically insulated from the microelectronic elements 30 within the second package 10 extend through the peripheral region 28, and at least some of the no-connect conductive interconnects extend through the central region 23. In other embodiments, all of the no-connect conductive interconnects 15d can extend within the peripheral region 28, or all of the no-connect conductive interconnects can extend within the central region 23.

In a particular example, at least some of the conductive interconnects 15 can be configured to carry at least one of power and reference potential signals, and such power and reference potential signals can extend within either or both of the central region 23 and the peripheral region 28.

Referring to FIG. 1C, the first conductive interconnects 15a (configured to carry address information) can include first and second sets of interconnects 70a and 70b disposed on respective first and second opposite sides of a theoretical plane P1 normal to the lower package face 12. The signal assignments of the first set of interconnects 70a can have 180° rotational symmetry about a theoretical rotational axis 29 (FIG. 1A) of the microelectronic package 10 with signal assignments of the second set of interconnects 70b. For example, a first interconnect 15a-1 in the first set 70a has 180° rotational symmetry about the theoretical rotational axis 29 with a first interconnect 15a-2 in the second set.

Such a 180° rotational symmetry configuration of the first conductive interconnects 15a can permit the first conductive interconnects 15a in a first microelectronic package 10a (FIG. 2B) to directly overlie and be joined with the first conductive interconnects configured to carry the same signal assignments in a second microelectronic package 10b stacked with the first package, when the first and second packages 10a and 10b are identical but rotated 180° relative to one another.

In one example, in an embodiment of the microelectronic package 10 having four microelectronic elements 30, signal assignments of the first conductive interconnects 15a on the first side of the theoretical plane P1 can be a mirror image of the signal assignments of the first conductive interconnects on the second side of the theoretical plane P1. Furthermore, signal assignments of the first conductive interconnects 15a on a first side of a second theoretical plane P2 normal to the lower package face 12 and the theoretical plane P1 can be a mirror image of the signal assignments of the first conductive interconnects on a second side of the second theoretical plane P2. In one example, signal assignments of the second conductive interconnects 15b on a first side of the second theoretical plane P2 can be a mirror image of the signal assignments of the second conductive interconnects on the second side of the second theoretical plane P2.

The second conductive interconnects 15b (configured to carry data information) can include third and fourth sets of interconnects 71a and 71b disposed on the respective first and second sides of the theoretical plane P1. The position of each of the second conductive interconnects 15b in the third set of interconnects 71a can have 180° rotational symmetry about the theoretical rotational axis 29 with a position of a corresponding no-connect conductive interconnect 15d. The position of each of the second conductive interconnects 15b in the fourth set of interconnects 71b also can have 180° rotational symmetry about the theoretical rotational axis 29 with a position of a corresponding no-connect conductive interconnect 15d.

For example, a second interconnect 15b-1 in the third set 71a has 180° rotational symmetry about the theoretical rotational axis 29 with a no-connect interconnect 15d-1 on the opposite side of the theoretical plane P1. Also, a second interconnect 15b-2 in the fourth set 71b has 180° rotational symmetry about the theoretical rotational axis 29 with a no-connect interconnect 15d-2 on the opposite side of the theoretical plane P1.

Such a 180° rotational symmetry configuration of the second conductive interconnects 15b can permit the second conductive interconnects 15b in a first microelectronic package 10a (FIG. 2B) to directly overlie and be joined with corresponding no-connect conductive interconnects in a second microelectronic package 10b stacked with the first package, as well as the second conductive interconnects 15b in the second microelectronic package 10b to directly underlie and be joined with corresponding no-connect conductive interconnects in the first microelectronic package 10a, when the first and second packages 10a and 10b are identical but rotated 180° relative to one another.

The third conductive interconnects 15c (configured to carry chip select information) can include fifth and sixth sets of interconnects 72a and 72b disposed on the respective first and second opposite sides of the theoretical plane P1. The signal assignments of the fifth set of interconnects 72a can have 180° rotational symmetry about the theoretical rotational axis 29 with signal assignments of the sixth set of interconnects 72b. For example, a third interconnect 15c-1 in the first set 72a has 180° rotational symmetry about the theoretical rotational axis 29 with a third interconnect 15c-2 in the second set.

Such a 180° rotational symmetry configuration of the third conductive interconnects 15c can permit the third conductive interconnects 15c in a first microelectronic package 10a (FIG. 2B) to directly overlie and be joined with the third conductive interconnects configured to carry chip select signal assignments in the second microelectronic package 10b stacked with the first package, when the first and second packages 10a and 10b are identical but rotated 180° relative to one another.

In one example, in an embodiment of the microelectronic package 10 having four microelectronic elements 30, signal assignments of the third conductive interconnects 15c on the first side of the theoretical plane P1 can be a mirror image of the signal assignments of the third conductive interconnects on the second side of the theoretical plane P1. Furthermore, signal assignments of the third conductive interconnects 15c on a first side of a second theoretical plane P2 normal to the lower package face 12 and the theoretical plane P1 can be a mirror image of the signal assignments of the third conductive interconnects on a second side of the second theoretical plane P2.

As can be seen in FIG. 1A, the theoretical rotational axis 29 extends through the center C of the package 10, intersecting a location at the center the lower package face 12. In some embodiments, the theoretical rotational axis 29 can extend near the center C of the package 10, intersecting a location near the center of the lower package face 12. The center C of the package 10 can be defined at the intersection between a first line L1 extending between a first opposite pair of the corners 14a, 14c located between adjacent ones of the peripheral edges 13 of the package 10, and a second line L2 extending between a second opposite pair of the corners 14b, 14d located between adjacent ones of the peripheral edges.

Figure 2A:
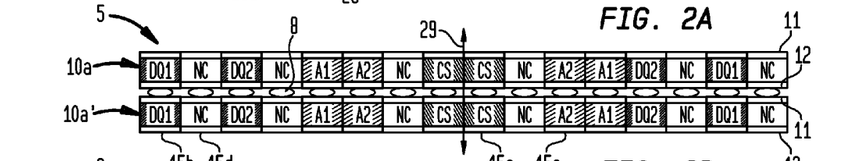
FIG. 2A is a diagrammatic side sectional view of a stacked assembly of two microelectronic packages according to an embodiment of the invention, taken along line A-A of FIG. 1C.

As can be seen in FIG. 2A, a microelectronic assembly 5 can include two identical microelectronic packages 10a and 10a', each of which can be the microelectronic package 10 described above. In such a microelectronic assembly 5, the upper terminals 45 of the second package 10a' can be joined to corresponding ones of the lower terminals 25 of the first package 10a. In one example, at least some of the conductive interconnects 15 of the first package 10a can overlie and can be electrically connected with corresponding ones of the conductive interconnects of the second package 10a'. As shown in FIG. 2A, the first microelectronic package 10a has the same rotational orientation about its rotational axis 29 relative to the second microelectronic package 10a'.

It can also be seen that each of the first, second, and third conductive interconnects 15a, 15b, and 15c of the first microelectronic package 10a overlies and is electrically connected with a corresponding one of the respective first, second, and third conductive interconnects of the second microelectronic package 10a' having the same signal assignment (e.g., the A2 address assignment for corresponding first conductive interconnects 15a, the DQ1 data I/O assignment for corresponding second conductive interconnects 15b, the CS chip select assignment for corresponding third conductive interconnects 15c). Each no-connect conductive interconnect 15d of the first microelectronic package 10a can overlie and can be electrically connected with a no-connect conductive interconnect of the second microelectronic package 10a'. Such a stacked microelectronic assembly 5 having two identical microelectronic packages 10a and 10a' having the same relative orientation about their rotational axes 29, can permit the microelectronic assembly 5 to have an expanded depth compared with a single microelectronic package 10a.

The microelectronic assembly 5 can include joining elements 8 attached to corresponding ones of the lower terminals 25 of the first package 10a and the upper terminals 45 of the second package 10a'. The joining elements 8 can be, for example, masses of a bond metal such as solder, tin, indium, a eutectic composition or combination thereof, or another joining material such as a conductive paste or a conductive adhesive. In a particular embodiment, the joints between the package terminals and contacts of an external component (e.g., the circuit panel 60) can include an electrically conductive matrix material such as described in commonly owned U.S. patent application Ser. Nos. 13/155,719 and 13/158,797, the disclosures of which are hereby incorporated by reference herein. In a particular embodiment, the joints can have a similar structure or be formed in a manner as described therein.

Figure 2B:
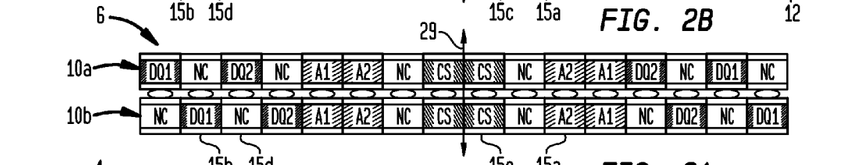
FIG. 2B is a diagrammatic side sectional view of a stacked assembly of two microelectronic packages according to another embodiment of the invention, taken along line A-A of FIG. 1C.

As can be seen in FIG. 2B, a microelectronic assembly can include two identical microelectronic packages 10a and 10b, each of which can be the microelectronic package 10 described above. In such a microelectronic assembly 6, the upper terminals 45 of the second package 10b can be joined to corresponding ones of the lower terminals 25 of the first package 10a. In one example, at least some of the conductive interconnects 15 of the first package 10a can overlie and can be electrically connected with corresponding ones of the conductive interconnects of the second package 10b. As shown in FIG. 2B, the first microelectronic package 10a is rotated about its rotational axis 29 by 180° relative to the second microelectronic package 10b.

It can also be seen that each of the first and third conductive interconnects 15a and 15c of the first microelectronic package 10a overlies and is electrically connected with a corresponding one of the respective first and third conductive interconnects of the second microelectronic package 10b having the same signal assignment. Each second conductive interconnect 15b of the first microelectronic package 10a can overlie and can be electrically connected with a no-connect conductive interconnect 15d of the second microelectronic package 10b, and each second conductive interconnect of the second microelectronic package can underlie and can be electrically connected with a no-connect conductive interconnect of the first microelectronic package. Such a stacked microelectronic assembly 5 having two identical microelectronic packages 10a and 10b rotated by 180° relative to each other about their rotational axes 29, can permit the microelectronic assembly 5 to have an expanded width compared with a single microelectronic package 10a.

Thus, the same microelectronic package 10 according to the invention can provide a first version of a stacked microelectronic assembly 6 having an expanded depth by stacking identical microelectronic packages 10 without rotating them relative to one another, and a second version of a stacked microelectronic assembly 7 having an expanded width by stacking identical microelectronic packages 10 and rotating them relative to one another by 180°.

As can be seen in FIG. 3A, a stacked microelectronic component 8 can include first and second stacked microelectronic assemblies 6 and 7, the first stacked microelectronic assembly being the stacked microelectronic assembly 6 described above, and the second stacked microelectronic assembly being the same as the microelectronic assembly 6 described above except that the locations of the third conductive interconnects 15c (chip select) have been swapped with locations of corresponding no-connect conductive interconnects 15d. The first and second stacked microelectronic assemblies 6 and 7 of the stacked microelectronic component 8 have the same relative orientation about their rotational axes 29. As shown in FIG. 3A, the rotational axis 29 of each of the microelectronic packages 10a, 10b, 10c, and 10d can be coincident with one another.

In such a stacked microelectronic component 8, the lower terminals 25 of the first microelectronic package 10a are joined with and electrically connected with the upper terminals 45 of the second microelectronic package 10b. Also, the lower terminals 25 of the second microelectronic package 10b are joined with and electrically connected with the upper terminals 45 of the third microelectronic package 10c. Furthermore, the lower terminals 25 of the third microelectronic package 10c are joined with and electrically connected with the upper terminals 45 of the fourth microelectronic package 10d.

It can be seen that first and second conductive interconnects 15a, 15b (address, data) of the first microelectronic package 10a have identical locations and signal assignments as the third microelectronic package 10c, and the first and second conductive interconnects of the second microelectronic package 10b have identical locations and signal assignments as the fourth microelectronic package 10d.

It can also be seen that each third conductive interconnect 15c (chip select) of each of the first and second microelectronic packages 10a and 10b is electrically connected with a no-connect conductive interconnect 15d of each of the third and fourth microelectronic packages 10c and 10d, and each third conductive interconnect of each of the third and fourth microelectronic packages is electrically connected with a no-connect conductive interconnect of each of the first and second microelectronic packages.

Such a stacked microelectronic component 8 having a first stacked microelectronic assembly 6 having two identical microelectronic packages 10a and 10b rotated by 180° relative to each other, being joined with a second stacked microelectronic assembly 7 having two identical microelectronic packages 10c and 10d rotated by 180° relative to each other can permit the microelectronic component 8 to have a dual rank configuration and an expanded width compared with a single microelectronic package 10.

As can be seen in FIG. 3A, the stacked microelectronic component 8 of FIG. 3B can be connected with a circuit panel or other interconnection substrate 11 having a plurality of contacts at a panel face thereof. Such an interconnection substrate 11 can have at least one device 40 mounted thereon. At least some of the upper terminals 45 of the first microelectronic package 10a can be joined to the contacts of the interconnection substrate 11.

Each device 40 can be a passive element such as a decoupling capacitor or a termination resistor. Such decoupling capacitors can be electrically connected to internal power and ground buses inside the microelectronic packages 10a, 10b, 10c, and 10d. In one example, the device 40 can be a driving element electrically connected to the first conductive interconnects 15a of the microelectronic packages 10a, 10b, 10c, and 10d, the driving element operable to drive the address information to the contacts of the microelectronic elements of the microelectronic packages.

The stacked microelectronic component 8 can also be connected with a circuit panel 60 having plurality of panel contacts 65 at a panel face 61 thereof, wherein at least some of the lower terminals 25 of the fourth microelectronic package 10d are joined to the panel contacts. The panel contacts 65 can be electrically connected with the first, second, and third microelectronic packages 10a, 10b, and 10c through the conductive interconnects 15 thereof.

As can be seen in FIG. 3B, a microelectronic component 2 can have can include at least one passive element 40. In one example, the at least one passive element 40 can be mounted to the upper package face 12 of the first package 10a. In one embodiment, the at least one passive element 40 can be mounted to an interconnection substrate 11 that is connected to the upper package face 12 of the first package 10a. In one example, the at least one passive element 40 can include at least one decoupling capacitor.

As can be seen in FIG. 4A, electrically conductive structure can include: traces 80, 81 formed on a dielectric layer of the microelectronic package 10 of FIGS. 1A-1C, connected with the first, second, and third conductive interconnects 15a, 15b, and 15c, and connected with the element contacts 35 of the microelectronic elements 30 through the first, second, and third conductive interconnects.

The traces include first traces 80 and second traces 81, the first traces extending in a first direction D1 perpendicular to a an element contact axis A1 between the contacts 35 of the microelectronic elements and the first and third conductive interconnects 15a and 15c, and the second traces extending in a second direction D2 parallel to the element contact axis A1 between the contacts of the microelectronic elements and the second conductive interconnects 15b.

Figure 4B:
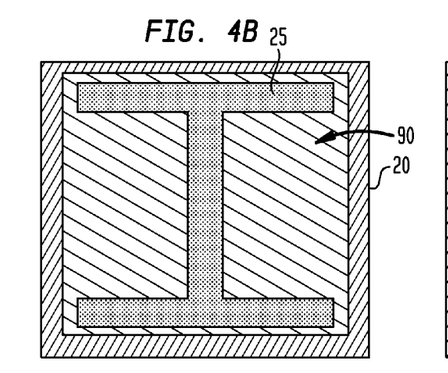
FIG. 4B-4E are top plan views of stages in a method of fabricating the microelectronic package of FIG. 4A.

FIGS. 4B-4E show stages in a method of fabricating the microelectronic package of FIGS. 1A and 4A. The process can begin as shown in FIG. 4B, by joining via-filled FR4 pre-punched inserts with a dielectric layer or substrate 20. Although only one dielectric layer or substrate 20 is shown in FIG. 4B, in one embodiment, a 2×2 mold may be used to form dielectric material onto the via-filled FR4 pre-punched inserts, so that four packages 10 can be formed while joined together.

Figure 4C:
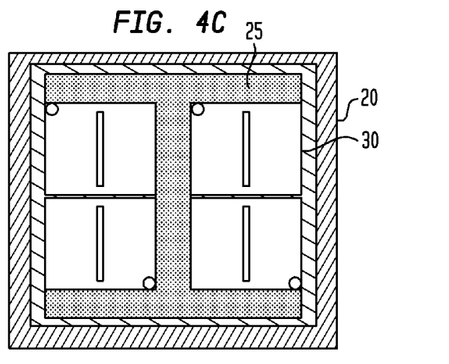
Figure 4D:
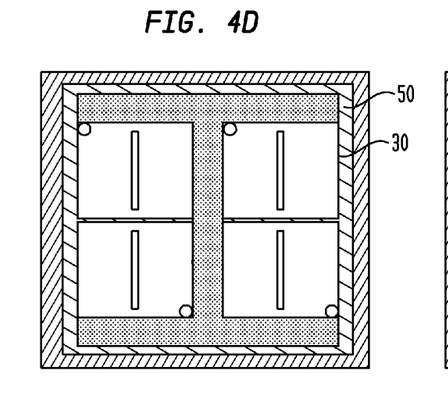

As shown in FIG. 4C, known good dies (microelectronic elements 30) can be placed into pre-punched openings 90. Next, as shown in FIG. 4D, an encapsulant 50 can be flowed, stenciled, screened or dispensed onto the rear surfaces of the microelectronic elements 30. In another example, the encapsulant can be a mold compound which is formed thereon by overmolding.

Figure 4E:
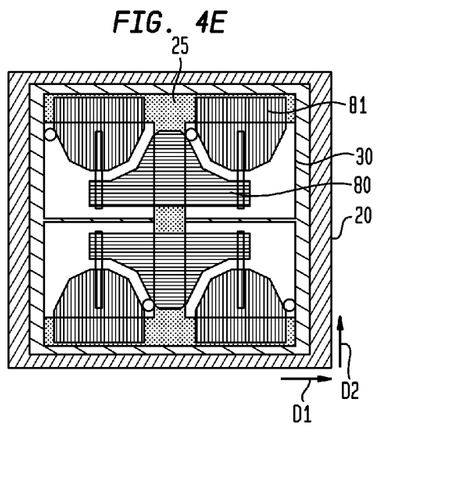

Then, as shown in FIG. 4E, metallization can be applied as first traces 80 extending in the direction D1 and second traces 81 extending in the direction D2 transverse to the direction D1, the first traces connected with the first and third conductive interconnects 15a and 15c, the second traces connected with the second conductive interconnects 15b.

Figure 5A:
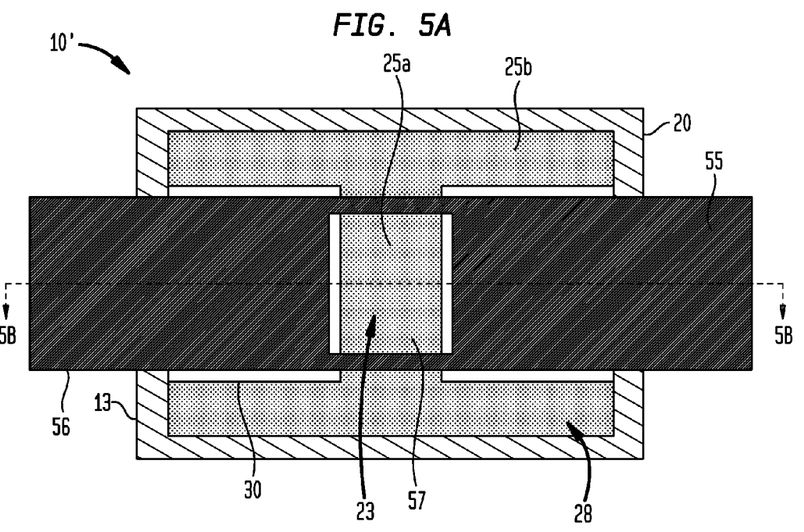
FIG. 5A is a top plan view of a microelectronic package having a heat spreader according to an embodiment of the present invention.

As can be seen in FIG. 5A, a microelectronic package 10' having some or all of the functional features of the package 10 described above can also include a heat spreader assembly 55. The heat spreader assembly 55 can include a heat spreader in thermal communication with the microelectronic elements 30, and an encapsulant 50 covering one or more exposed surface of the heat spreader. The heat spreader can be coupled to a surface of the microelectronic elements 30 by a thermally conductive adhesive or grease, for example. In one example, the heat spreader can at least partially overlie a rear face 33 of the microelectronic element 30 of the package 10.

Figure 5B:
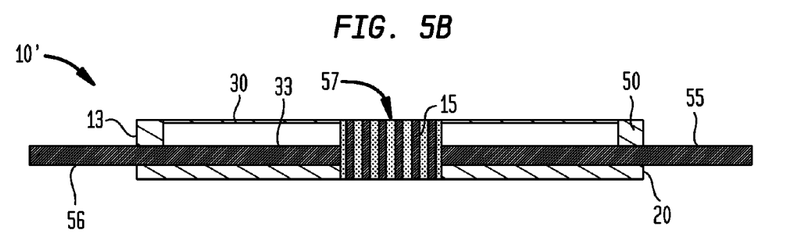
FIG. 5B is one possible side sectional view of the microelectronic package of FIG. 5A, taken along the line 5B-5B of FIG. 5A.

As shown in FIGS. 5A and 5B, lateral portions 56 of the heat spreader 55 can extend beyond one or two lateral edges 13 of the microelectronic package 10. The heat spreader 55 can have an opening 57 extending therethrough. The opening 57 can be aligned with at least a portion of the central region 23 of the package 10, such that at least some of the first conductive interconnects 15a can extend therethrough. The heat spreader can also permit at least some of the second conductive interconnects 15b to extend through the package 10 on either side of the heat spreader, in the peripheral region 28 of the package.

The heat spreader in the heat spreader assembly 55 can be partly or entirely made of any suitable thermally conductive material. Examples of suitable thermally conductive material include, but are not limited to, metal, graphite, thermally conductive adhesives, e.g., thermally-conductive epoxy, a solder, or the like, or a combination of such materials. In one example, the heat spreader can be a substantially continuous sheet of metal.

In one embodiment, the heat spreader can include a metallic layer disposed adjacent to the microelectronic element 30. The metallic layer may be exposed at the upper or lower face of the first package 10'. Alternatively, the heat spreader can include an overmold or an encapsulant 50 covering at least a rear surface of the microelectronic elements 30. In one example, the heat spreader can be in thermal communication with at least one of the front surface and rear surface of the microelectronic element 30. The heat spreader can improve heat dissipation to the surrounding environment.

In a particular embodiment, a pre-formed heat spreader made of metal or other thermally conductive material may be attached to or disposed on a rear surface of the microelectronic element 30 with a thermally conductive material such as thermally conductive adhesive or thermally conductive grease. The adhesive, if present, can be a compliant material that permits relative movement between the heat spreader and the microelectronic element 130 to which it is attached, for example, to accommodate differential thermal expansion between the compliantly attached elements. The heat spreader may be a monolithic structure. Alternatively, the heat spreader may include multiple spreader portions spaced apart from one another. In a particular embodiment, the heat spreader may be or include a layer of solder joined directly to at least a portion of the rear surface of the microelectronic element 30.

Figure 6:
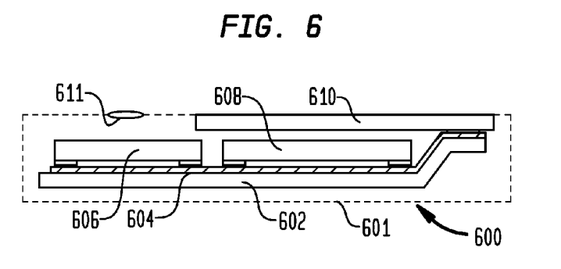
FIG. 6 is a schematic sectional view illustrating a system according to an embodiment of the invention.

The microelectronic packages, stacked microelectronic assemblies, and stacked microelectronic components described above with reference to FIGS. 1A through 5B above can be utilized in construction of diverse electronic systems, such as the system 600 shown in FIG. 6. For example, the system 600 in accordance with a further embodiment of the invention includes a plurality of modules or components 606 such as the microelectronic packages, stacked microelectronic assemblies, and stacked microelectronic components as described above, in conjunction with other electronic components 608, 610 and 611.

In the exemplary system 600 shown, the system can include a circuit panel, motherboard, or riser panel 602 such as a flexible printed circuit board, and the circuit panel can include numerous conductors 604, of which only one is depicted in FIG. 6, interconnecting the modules or components 606, 608, 610 with one another. Such a circuit panel 602 can transport signals to and from each of the microelectronic packages and/or microelectronic assemblies included in the system 600. However, this is merely exemplary; any suitable structure for making electrical connections between the modules or components 606 can be used.

In a particular embodiment, the system 600 can also include a processor such as the semiconductor chip 608, such that each module or component 606 can be configured to transfer a number N of data bits in parallel in a clock cycle, and the processor can be configured to transfer a number M of data bits in parallel in a clock cycle, M being greater than or equal to N.

In the example depicted in FIG. 6, the component 608 is a semiconductor chip and component 610 is a display screen, but any other components can be used in the system 600. Of course, although only two additional components 608 and 611 are depicted in FIG. 6 for clarity of illustration, the system 600 can include any number of such components.

Modules or components 606 and components 608 and 611 can be mounted in a common housing 601, schematically depicted in broken lines, and can be electrically interconnected with one another as necessary to form the desired circuit. The housing 601 is depicted as a portable housing of the type usable, for example, in a cellular telephone or personal digital assistant, and screen 610 can be exposed at the surface of the housing. In embodiments where a structure 606 includes a light-sensitive element such as an imaging chip, a lens 611 or other optical device also can be provided for routing light to the structure. Again, the simplified system shown in FIG. 6 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A stacked microelectronic assembly, comprising:
   first and second microelectronic packages arranged in a stacked configuration, each of the microelectronic packages having:
   a lower package face and an upper package face opposite the lower package face, lower terminals at the lower package face, and upper terminals at the upper package face;
   a microelectronic element having memory storage array function and contacts at an element face thereof; and
   conductive interconnects each electrically connecting at least one lower terminal with at least one upper terminal, at least some of the conductive interconnects electrically connected with the contacts of the microelectronic element, the conductive interconnects including: first conductive interconnects configured to carry address information, second conductive interconnects configured to carry data information to and from the microelectronic elements, and no connect conductive interconnects that are electrically insulated from the microelectronic element within the respective microelectronic package, wherein each of the first conductive interconnects of the first microelectronic package overlies and is electrically connected with a corresponding one of the first conductive interconnects of the second microelectronic package having the same signal assignment, and wherein each second conductive interconnect of the first microelectronic package overlies and is electrically connected with a no-connect conductive interconnect of the second microelectronic package, and each second conductive interconnect of the second microelectronic package underlies and is electrically connected with a no-connect conductive interconnect of the first microelectronic package.

2. The microelectronic assembly as claimed in claim 1, wherein each microelectronic element is a first microelectronic element, and each microelectronic package has a second microelectronic element having memory storage array function and contacts at an element face thereof, at least some of the conductive interconnects of each microelectronic package being electrically connected with the contacts of the respective second microelectronic element, and wherein the conductive interconnects of each microelectronic package include third conductive interconnects configured to carry chip select information to and from the microelectronic elements of the respective microelectronic package, and each of the third conductive interconnects of the first microelectronic package overlies and is electrically connected with a corresponding one of the third conductive interconnects of the second microelectronic package.

3. The microelectronic assembly as claimed in claim 2, wherein the element faces of the first and second microelectronic elements of each microelectronic package are arranged in a single plane parallel to the respective lower package face.

4. The microelectronic assembly as claimed in claim 3, wherein the element faces of the first and second microelectronic elements of each microelectronic package are spaced apart from one another in a direction of the single plane to define a central region between adjacent edges of the microelectronic elements and peripheral regions between peripheral edges of the element faces and respective adjacent peripheral package edges, the first conductive interconnects being aligned with the central region.

5. The microelectronic assembly as claimed in claim 4, wherein the second conductive interconnects of each microelectronic package are aligned with at least one of the peripheral regions of the respective microelectronic package.

6. The microelectronic assembly as claimed in claim 1, wherein the at least some of the first conductive interconnects of each microelectronic package are configured to carry address information usable by circuitry within the respective microelectronic package to determine an addressable memory location from among all the available addressable memory locations of a memory storage array of the respective microelectronic element.

7. The microelectronic assembly as claimed in claim 1, wherein the first conductive interconnects of each microelectronic package are configured to carry all of the address information usable by circuitry within the respective microelectronic package to determine an addressable memory location from among all the available addressable memory locations of a memory storage array within the respective microelectronic element.

8. The microelectronic assembly as claimed in claim 1, wherein the first conductive interconnects of each microelectronic package are configured to carry address information and command information.

9. The microelectronic assembly as claimed in claim 1, wherein each microelectronic package further includes a substrate, and a surface of a dielectric layer that defines one of the upper package face or the lower package face of the respective microelectronic package is a first surface of the respective substrate.

10. The microelectronic assembly as claimed in claim 9, wherein the substrate of each microelectronic package has at least one aperture extending through a thickness thereof, and wherein the contacts of the microelectronic element of each microelectronic package are aligned with the at least one aperture of the respective microelectronic package and electrically connected with substrate contacts at the first surface of the respective substrate by a plurality of leads.

11. The microelectronic assembly as claimed in claim 10, wherein at least some of the leads of each microelectronic package include wire bonds extending through the at least one aperture of the respective microelectronic package.

12. The microelectronic assembly as claimed in claim 1, further comprising at least one passive element electrically connected to the first microelectronic package.

13. The microelectronic assembly as claimed in claim 12, wherein the at least one passive element includes at least one decoupling capacitor.

14. The microelectronic assembly as claimed in claim 1, further comprising a circuit panel having plurality of panel contacts at a panel face thereof and at least one of: a decoupling capacitor, a termination resistor, or a driving element thereon, and wherein at least at least some of the upper terminals of the first microelectronic package are joined to the panel contacts.

15. The microelectronic assembly as claimed in claim 1, further comprising a circuit panel having a plurality of panel contacts at a panel face thereof, wherein at least some of the lower terminals of the second microelectronic package are joined to the panel contacts.

16. The microelectronic assembly as claimed in claim 15, wherein the panel contacts are electrically connected with the microelectronic elements of the first microelectronic package through the conductive interconnects of the second microelectronic package.

17. The microelectronic assembly as claimed in claim 1, further comprising a device electrically connected to the first conductive interconnects of the first and second microelectronic packages, the device operable to drive the address information to the contacts of the microelectronic elements of the first and second microelectronic packages.

18. A stacked microelectronic component including first and second stacked microelectronic assemblies each as claimed in claim 2, wherein the first and second conductive interconnects of the first microelectronic package of the first stacked microelectronic assembly have identical locations and signal assignments as the first microelectronic package of the second stacked microelectronic assembly, and the first and second conductive interconnects of the second microelectronic package of the first stacked microelectronic assembly have identical locations and signal assignments as the second microelectronic package of the second stacked microelectronic assembly, and wherein each third conductive interconnect of each microelectronic package of the first microelectronic assembly is electrically connected with a no-connect conductive interconnect of each microelectronic package of the second microelectronic assembly, and each third conductive interconnect of each microelectronic package of the second microelectronic assembly is electrically connected with a no-connect conductive interconnect of each microelectronic package of the second microelectronic assembly.

19. A system comprising a microelectronic assembly as claimed in claim 1 and one or more other electronic components electrically connected to the microelectronic assembly.

20. The system as claimed in claim 19, further comprising a housing, the microelectronic assembly and the one or more other electronic components being assembled with the housing.

\* \* \* \* \*